United States Patent

Lee et al.

[11] Patent Number: 5,918,127
[45] Date of Patent: *Jun. 29, 1999

[54] METHOD OF ENHANCING ELECTROSTATIC DISCHARGE (ESD) PROTECTION CAPABILITY IN INTEGRATED CIRCUITS

[75] Inventors: Chen-Wei Lee; Kuan-Cheng Su, both of Taipei, Taiwan

[73] Assignee: United Microelectronics Corp., Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/650,350

[22] Filed: May 20, 1996

[51] Int. Cl.$^6$ ................................................ H01L 21/8246
[52] U.S. Cl. ............................................ 438/278; 438/217
[58] Field of Search ..................... 438/275–278, 438/282, 286, 289–291, 526, FOR 205, FOR 208, FOR 160, 217

[56] References Cited

U.S. PATENT DOCUMENTS

| | | | |
|---|---|---|---|
| 4,904,615 | 2/1990 | Okuyama et al. | 438/277 |
| 5,221,635 | 6/1993 | Duvvury | 438/286 |
| 5,374,565 | 12/1994 | Hsue et al. | 438/275 |
| 5,413,949 | 5/1995 | Hong | 438/290 |
| 5,545,772 | 8/1996 | Lee et al. | 438/286 |

FOREIGN PATENT DOCUMENTS 5-36909  2/1993  Japan .

*Primary Examiner*—Chandra Chaudhari
*Attorney, Agent, or Firm*—Rabin & Champagne P.C.

[57] ABSTRACT

A semiconductor fabrication method that enhances the ESD (electrostatic discharge) protection capability of an ESD protective device provided in an integrated circuit such as a mask-programmed ROM, allows the mask-programmed ROM to be downsized while still providing adequate ESD protection capability, and allows the mask-programmed ROM to be fabricated in a smaller size, while nonetheless providing adequate ESD protection capability for the internal circuit. Initially, a mask for the ion implantation process for the ROM is prepared. The mask is patterned additionally with a plurality of strips used to define breakdown voltage controlling areas in the ESD protective device. Then, the ion implantation process is performed through the mask so as to form the breakdown voltage controlling areas each beneath the drain of the n-type CMOS transistor. The breakdown voltage controlling areas are heavily doped, thereby reducing the breakdown voltage at the junction between the drain and the p-well in the n-type CMOS transistor. This enhances the ESD protection capability of the integrated circuit.

4 Claims, 2 Drawing Sheets

METHOD OF ENHANCING ELECTROSTATIC DISCHARGE (ESD) PROTECTION CAPABILITY IN INTEGRATED CIRCUITS

BACKGROUND OF THE INVENTION

1. Field of the Invention

The invention relates to electrostatic discharge (ESD) protection for an integrated circuit (IC), and more particularly, to a method for enhancing the ESD protection capability of an ESD protective device provided in an integrated circuit for enhanced protection of the IC against electrostatic discharge.

2. Description of the Background Art

Electrostatic discharge (ESD) is a movement of static electricity from a nonconductive surface, that could cause damage to semiconductors and other circuit components in ICs. A person walking on a carpet, for instance, can carry electrostatic charge in an amount up to several thousands of volts under high humidity conditions, and over 10,000 volts under low humidity conditions. When a IC is touched by a human hand, the electrostatic charge flows from the person's body to the IC, resulting in an ESD having an energy level up to millions of joules (MJ) and a discharge period as short as only a few nanoseconds (ns) or microseconds ($\mu$s). As a consequence, the instantaneous power level of the ESD would be as high as several hundreds of kilowatts with an electric current up to several dozens of amperes, which would cause severe damage to the IC. CMOS (complementary metal-oxide semiconductor) logic ICs are especially vulnerable to ESD.

A conventional method of providing ESD protection for an integrated circuit is to include an ESD protective device having an n-type CMOS transistor, in the integrated circuit. The n-type CMOS transistor can be either a gate-grounded NMOS transistor or gate-coupled NMOS transistor. In semiconductor fabrication, the n-type CMOS transistor can be further downsized so as to reduce the overall size and increase the degree of integration of the integrated circuit. However, the conventional ESD protective device, in order to provide adequate ESD protection capability, should be relatively large, thus restricting the downsizing of the integrated circuit. Therefore, a need exists for a new and improved method that allows an ESD protective device to be fabricated at a reduced size, but nonetheless provides adequate ESD protection for the integrated circuit. Moreover, in order to allow cost-effective manufacture of the integrated circuit, the new and improved method preferably should be carried out without having to devise or include additional process steps in the overall fabrication process for the integrated circuit.

SUMMARY OF THE INVENTION

It is therefore an object of the invention to provide a method of fabricating an ESD protective device, that can be downsized but nonetheless provides enhanced ESD protection for the integrated circuit.

It is another object of the invention to provide a method of fabricating an ESD protective device, which does not increase the overall number of process steps in the manufacture of the integrated circuit in which the device is provided.

In accordance with the foregoing and other objects of the invention, a new and improved method for enhancing ESD protection in an integrated circuit is provided. The integrated circuit includes an internal circuit and an ESD protective device, the internal circuit being of the type that uses an ion implantation process for coding thereof, and the ESD protective device being of the type that includes at least an n-type CMOS transistor. The method includes a step of preparing a mask for the ion implantation process, the mask including a plurality of patterns used to define a plurality of breakdown voltage controlling areas in the ESD protective device. The method also includes a step of performing the ion implantation through the mask, so as to form the plurality of breakdown voltage controlling areas, each located beneath the drain of the n-type CMOS transistor.

The ion implantation process is performed by using a source of, for example, boron ions having an energy of 120 to 180 KeV to provide a concentration of about $1\times10^{13}$ to $5\times10^{14}$ atoms/cm$^2$ in the breakdown voltage controlling areas. This allows the breakdown voltage controlling areas to be more heavily doped, thereby reducing the breakdown voltage at the junction between the drain and the p-well in the n-type CMOS transistor. In other words, the capability of the device to provide ESD protection of the integrated circuit is enhanced.

BRIEF DESCRIPTION OF DRAWINGS

The invention can be more fully understood by reading the subsequent detailed description of the preferred embodiment, with reference to the accompanying drawings, wherein.

DETAILED DESCRIPTION OF THE PREFERRED EMBODIMENT

Figure 1A:
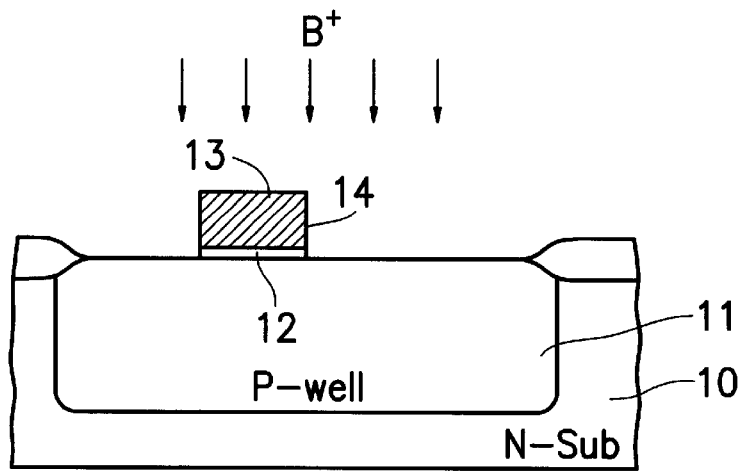
FIGS. 1A–1C are schematic sectional views depicting the steps involved in a method according to the invention for enhancing the ESD protection capability of an ESD protective device provided in a mask-programmed ROM.
Figure 1B:
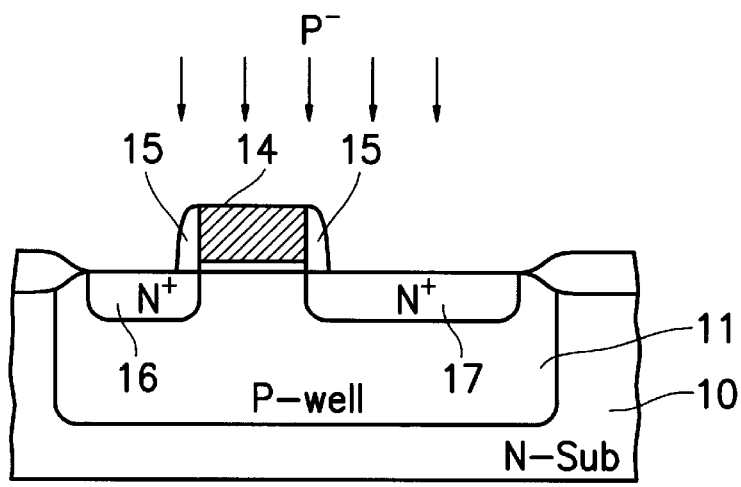
Figure 1C:
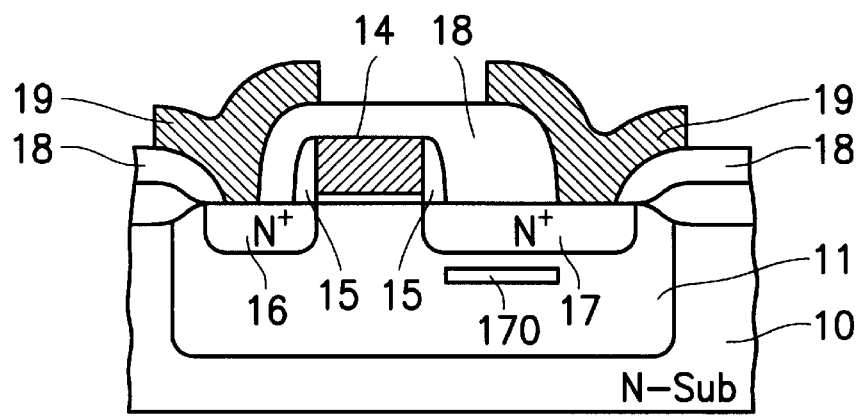

A mask-programmed ROM typically includes two circuit parts: a data storage circuit which is hereinafter referred to in this specification as "internal circuit", and an ESD protective circuit including at least an n-type CMOS transistor which is hereinafter referred to as "ESD protective device". FIGS. 1A–1C are schematic sectional views depicting the steps involved in a method according to the invention for enhancing the ESD protection capability of the ESD protective device provided in a mask-programmed ROM. For simplification of description, FIGS. 1A–1C depict only the steps for fabricating the n-type CMOS transistor in accordance with the invention. All of the other parts of the fabrication of the mask-programmed ROM are based on conventional techniques not related to the invention, so a detailed description thereof will not be provided in this specification.

Referring first to FIG. 1A, the illustrated wafer is based on an n-type silicon substrate 10 which has been fabricated up to a stage at which the area for the ESD protective device has been defined. An ion implantation process is then performed on the wafer using, for example, boron ions, to form a p-well 11 in the n-type silicon substrate 10. Subsequently, a gate oxide layer 12 is formed, for example by the dry oxidation method, over the p-well 11, and a polysilicon layer 13 is formed, for example by the chemical-vapor deposition (CVD) method, over the gate oxide layer 12. After that, a mask process is performed for selective removal of the gate oxide layer 12 and polysilicon layer 13, so as to form a gate 14 for the n-type CMOS transistor.

Referring next to FIG. 1B, in a subsequent step, spacers 15 are formed on the sidewalls of the gate 14. An ion implantation process is then performed on the wafer using the gate 14 and the spacers 15 as a mask, so as to diffuse dopant such as phosphorous ions into selected parts of the p-well 11, thereby forming a source 16 and a drain 17 in the p-well 11 at respective opposite sides of the gate 14.

Referring next to FIG. 1C, a dielectric layer 18, of, for example borophosphosilicate glass (BPSG), is next deposited by the CVD method over the p-well 11 and the gate 14. A mask process is then performed on the wafer so as to produce a plurality of contact holes through the dielectric layer 18. After that, an aluminum metallization layer is formed by sputtering over the wafer, and then a mask process is performed on the wafer so as to etch away selected parts of the aluminum metallization layer, to form a plurality of source/drain contacts 19 and conductive paths (not shown).

Figure 2:
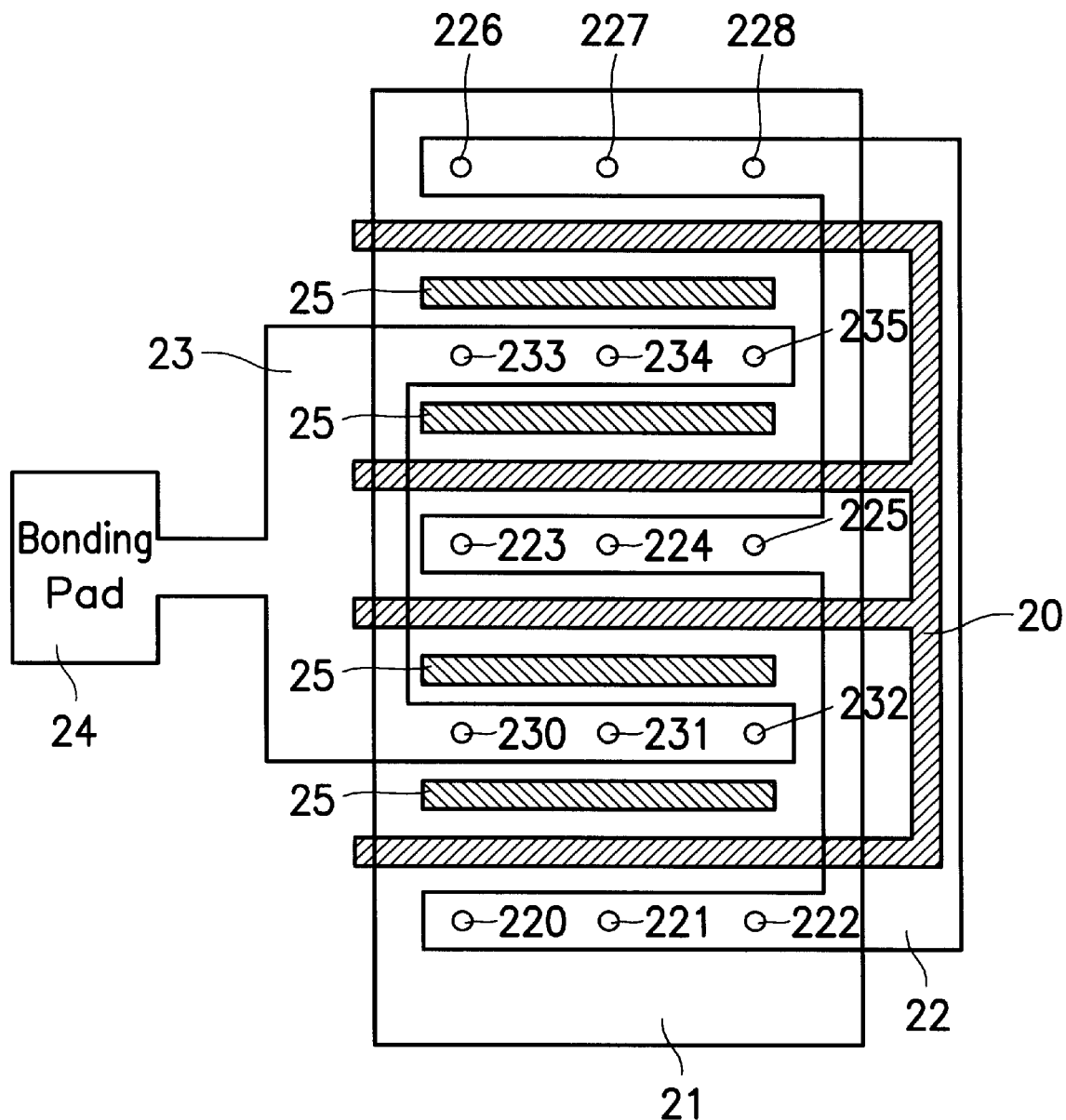
FIG. 2 shows the layout of a mask which is used for the fabrication of the mask-programmed ROM.

Referring now to FIG. 2, there is shown the layout pattern of a mask employed by the invention for enhancing the ESD protection capability of the ESD protective device in the mask-programmed ROM. Since the part of the mask pattern for forming the internal circuit of the mask-programmed ROM is conventional in structure, formation, and use, and not related to the invention, it is not shown in FIG. 2.

In the mask pattern shown in FIG. 2, the shaded area 20 is used to define gates on the ESD protective device, and the block 21 is used to define source/drain regions. A conductive path 22 is used to electrically interconnect source contacts 220, 221, 222, 223, 224, 225, 226, 227, 228, and a conductive path 23 is used to electrically interconnect drain contacts 230, 231, 232, 233, 234, 235 to a bonding pad 24.

In the ESD protective device, the drain contacts are usually separated from the gates by a specific spacing, for the purpose of avoiding cracking of the gate oxide layers and short-circuiting of the sources and drains due to ESD.

Referring to both FIG. 1C and FIG. 2, in accordance with the invention a plurality of strips 25 are provided on the mask pattern, as illustrated in FIG. 2. During the coding process for the mask-programmed ROM, the ions are also implanted through openings that are defined by the strips 25 on the mask, to be diffused into selected parts of the p-well 11, thereby forming a so-called breakdown voltage controlling area 170 in the p-well 11 as illustrated in FIG. 1C. The ion implantation process is performed using a source of, for example, boron ions having an energy of 120 to 180 KeV to provide in the breakdown voltage controlling area a concentration of $1 \times 10^{13}$ to $5 \times 10^{14}$, atoms/cm$^2$. This allows the breakdown voltage controlling area 170 to be more heavily doped than the p-well 11, thereby reducing the breakdown voltage at the junction between the drain 17 and the p-well 11. In other words, the n-type CMOS transistor of FIG. 1C provides enhanced ESD protection for the internal circuit of the mask-programmed ROM.

The invention provides the following benefits. Since the ion implantation process for coding the mask-programmed ROM is also used at the same time for forming the breakdown voltage controlling area 170, no additional process steps are required in the overall fabrication of the mask-programmed ROM. Further, since the mask used for forming the breakdown voltage controlling area 170 is also the mask used for coding the mask-programmed ROM, except for the provision of the additional pattern (i.e., the strips 25), no additional cost in producing the mask is required. Moreover, since the ESD protection capability of the n-type CMOS transistor in the mask-programmed ROM is enhanced to a higher level, the ESD protective device can be downsized to a level that can still provide ESD protection equal to that of conventional devices. The mask-programmed ROM can therefore be downsized, but nonetheless provide substantially the same ESD protection capability. Furthermore, due to the latter benefit, the chip size of the mask-programmed ROM can be downsized so that manufacturing costs can be reduced.

The invention has been described above with reference to an exemplary preferred embodiment. However, it is to be understood that the scope of the invention is not limited to the disclosed embodiment. For example, the invention can be applied to other types of integrated circuits, such as CPUs and other types of memory devices. Accordingly, the invention is intended to cover various modifications and similar arrangements within the scope defined in the appended claims. The scope of the claims should be accorded the broadest interpretation so as to encompass all such modifications and similar arrangements.

What is claimed is:

1. A method for coding, and enhancing ESD protection of, a mask-programmed ROM integrated circuit which includes an internal circuit and an ESD protective device, the internal circuit and the ESD protection device being formed in an area of a substrate, the ESD protective device including at least n-type CMOS transistors in said area, the method comprising:

(1) preparing over said area a mask defining complete coding of the entire internal circuit, the mask including a plurality of patterns that define a plurality of breakdown voltage controlling areas in the ESD protective device; and (2) after said preparing, performing only once an ion implantation process by implanting boron ions in said area only once, through the mask so as to simultaneously completely code the internal circuit, and form the plurality of breakdown voltage controlling areas beneath the drains of all of the respective n-type CMOS transistors.

2. A method for coding, and enhancing ESD protection of, a mask-programmed ROM integrated circuit which includes an internal circuit and an ESD protective device, the internal circuit and the ESD protection device being formed in an area of a substrate, the ESD protective device including at least an n-type CMOS transistor in said area, the method comprising:

(1) preparing over said area a mask defining complete coding of the entire internal circuit, the mask including a pattern that defines a breakdown voltage controlling area in the ESD protective device; and (2) after said preparing, performing only once an ion implantation process by implanting boron ions in said area only once, through the mask so as to simultaneously completely code the internal circuit, and form the breakdown voltage controlling area beneath the drain of the n-type CMOS transistor.

3. A method as claimed in claim 2, wherein the boron ions are implanted with an energy of 120 to 180 KeV to provide a concentration of about $1 \times 10^{13}$ to $5 \times 10^{14}$ atoms/cm$^2$.

4. A method as claimed in claim 1, wherein the boron ions are implanted with an energy of 120 to 180 KeV to provide a concentration of about $1 \times 10^{13}$ to $5 \times 10^{14}$ atoms/cm$^2$.

* * * * *